(12) United States Patent
Shen et al.

(10) Patent No.: US 9,665,000 B1
(45) Date of Patent: May 30, 2017

(54) METHOD AND SYSTEM FOR EUV MASK CLEANING WITH NON-THERMAL SOLUTION

(71) Applicant: Taiwan Semiconductor Manufacturing Company, Ltd., Hsin-Chu (TW)

(72) Inventors: Ching-Wei Shen, Hsinchu (TW); Chi-Lun Lu, Hsinchu (TW); Kuan-Wen Lin, Taichung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/942,633

(22) Filed: Nov. 16, 2015

(51) Int. Cl.
| | | |
|---|---|---|
| *G03F 1/86* | (2012.01) |
| *G03F 1/82* | (2012.01) |
| *G03F 1/22* | (2012.01) |
| *G03F 7/20* | (2006.01) |
| *G03F 7/32* | (2006.01) |
| *B08B 3/08* | (2006.01) |
| *B08B 3/10* | (2006.01) |
| *B08B 7/00* | (2006.01) |
| *G03F 1/72* | (2012.01) |
| *G03F 1/84* | (2012.01) |

(52) U.S. Cl.
CPC ............ *G03F 1/86* (2013.01); *B08B 3/08* (2013.01); *B08B 3/10* (2013.01); *B08B 7/0035* (2013.01); *G03F 1/22* (2013.01); *G03F 1/82* (2013.01); *G03F 7/2004* (2013.01); *G03F 7/32* (2013.01); *G03F 1/72* (2013.01); *G03F 1/84* (2013.01)

(58) Field of Classification Search
CPC ..... G03F 1/86; G03F 7/32; G03F 1/22; G03F 7/2004; G03F 1/82; G03F 1/72; B08B 3/08; B08B 3/10; B08B 7/0035
See application file for complete search history.

(56) References Cited

U.S. PATENT DOCUMENTS

| | | |
|---|---|---|
| 8,628,897 B1 | 1/2014 | Lu et al. |
| 8,679,707 B2 | 3/2014 | Lee et al. |
| 8,691,476 B2 | 4/2014 | Yu et al. |
| 8,709,682 B2 | 4/2014 | Chen et al. |
| 8,715,890 B2 | 5/2014 | Tu et al. |
| 8,722,286 B2 | 5/2014 | Yu et al. |
| 8,753,788 B1 | 6/2014 | Yu et al. |
| 8,764,995 B2 | 7/2014 | Chang et al. |
| 8,765,330 B2 | 7/2014 | Shih et al. |
| 8,765,582 B2 | 7/2014 | Hsu et al. |
| 8,785,084 B2 | 7/2014 | Lu et al. |
| 8,828,625 B2 | 9/2014 | Lu et al. |
| 8,841,047 B2 | 9/2014 | Yu et al. |
| 8,877,409 B2 | 11/2014 | Hsu et al. |

(Continued)

FOREIGN PATENT DOCUMENTS

| | | |
|---|---|---|
| CN | 102078869 | 6/2011 |
| TW | I339317 | 3/2011 |

*Primary Examiner* — Stewart Fraser
(74) *Attorney, Agent, or Firm* — Haynes and Boone, LLP

(57) ABSTRACT

The present disclosure provides a method of repairing a mask. The method includes inspecting a mask to identify a defect on the mask; performing a cleaning process to the mask using a non-thermal chemical solution to the mask; and repairing the mask to remove the defect from the mask. The non-thermal chemical solution is cooled by a cooling module to a working temperature below room temperature.

20 Claims, 14 Drawing Sheets

(56) References Cited

U.S. PATENT DOCUMENTS

| | | | |
|---|---|---|---|
| 2006/0137717 A1* | 6/2006 | Lee | G03F 1/82 |
| | | | 134/19 |
| 2008/0185021 A1* | 8/2008 | Chiu | G03F 1/82 |
| | | | 134/28 |
| 2008/0251108 A1* | 10/2008 | Nagai | B08B 3/08 |
| | | | 134/56 R |
| 2012/0164564 A1 | 6/2012 | Amro et al. | |
| 2012/0240958 A1* | 9/2012 | Higuchi | H01L 21/67051 |
| | | | 134/10 |

* cited by examiner $H_2SO_4 + H_2O_2 = H_2SO_5 + H_2O$ — 124

$H_2SO_5 + C_xH_y = CO_2 + H_2SO_4 + H_2O$ — 126

+ heat (120 deg. C)

FIG. 6

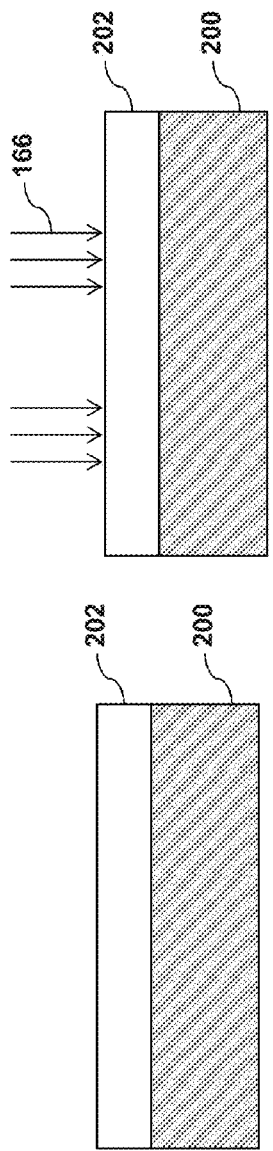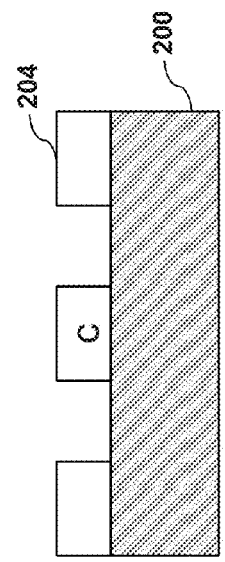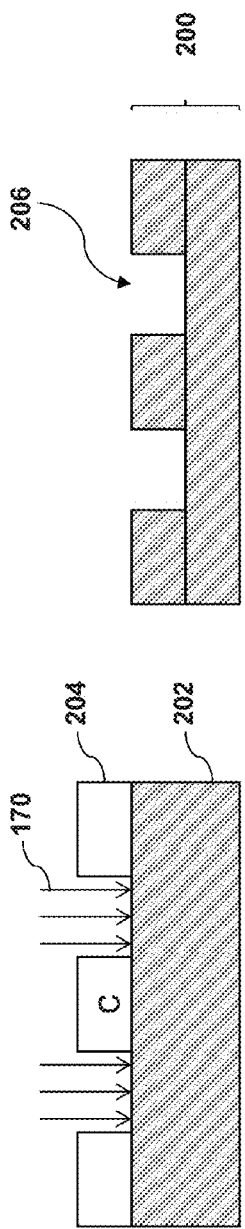

METHOD AND SYSTEM FOR EUV MASK CLEANING WITH NON-THERMAL SOLUTION

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component or line that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed. In one example associated with lithography patterning, a photomask (or mask) to be used in a lithography process has a circuit pattern defined thereon and is to be transferred to wafers. The pattern on the mask needs to be more accurate since the lithography patterning is more sensitive to the mask defects for small feature sizes in the advanced technology nodes. Accordingly, a mask is repaired to eliminate defects. However, the existing method and system are not effective and may introduce additional defects to the photomask. What are needed are the system and the method for fabricating the photomask to address the above issues.

BRIEF DESCRIPTION OF THE DRAWINGS

The present disclosure is best understood from the following detailed description when read with accompanying figures. It is emphasized that, in accordance with the standard practice in the industry, various features are not drawn to scale and are used for illustration purpose only. In fact, the dimension of the various features may be arbitrarily increased or reduced for clarity of discussion.

FIG. 6 illustrates formulas associated with a cleaning process constructed according to various embodiments.

FIGS. 14, 15, 16, 17 and 18 are sectional views of a semiconductor wafer at various fabrication stages in accordance with some embodiments.

DETAILED DESCRIPTION

Figure 1:
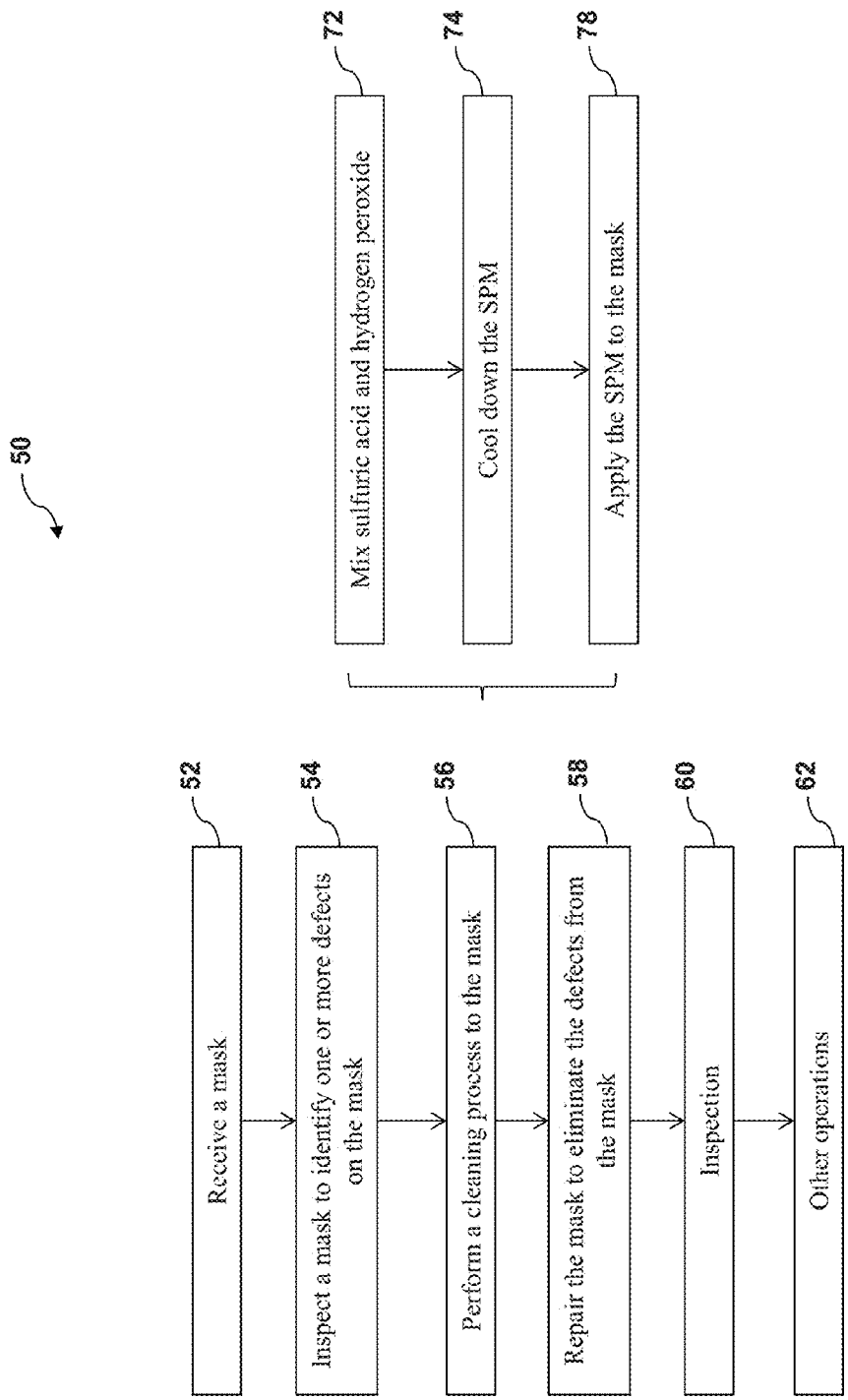
FIG. 1 is a flowchart of a method for repairing a mask in accordance with some embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a flowchart of a method 50 of repairing and using a photomask constructed in accordance with some embodiments. The method 50 is described with reference to FIG. 1 and other figures. The mask repairing may be implemented in a mask shop for making a mask, or in a fab for fabricating a semiconductor device on a wafer using a mask. It is understood that additional operations may be implemented before, during, and after the method 50, and some of the operations may be replaced, eliminated, or moved around for additional embodiments of the method 50. The method 10 is only an exemplary embodiment, and is not intended to limit the present invention beyond what is explicitly recited in the claims.

The method 50 begins at 52 by receiving or providing a mask (mask, photomask and reticle are used interchangeably). The mask is used to fabricate semiconductor wafers during lithography exposing processes. The mask includes a substrate and a pattern formed thereon or to be formed on the substrate. The pattern is defined according to a circuit design.

Figure 2:
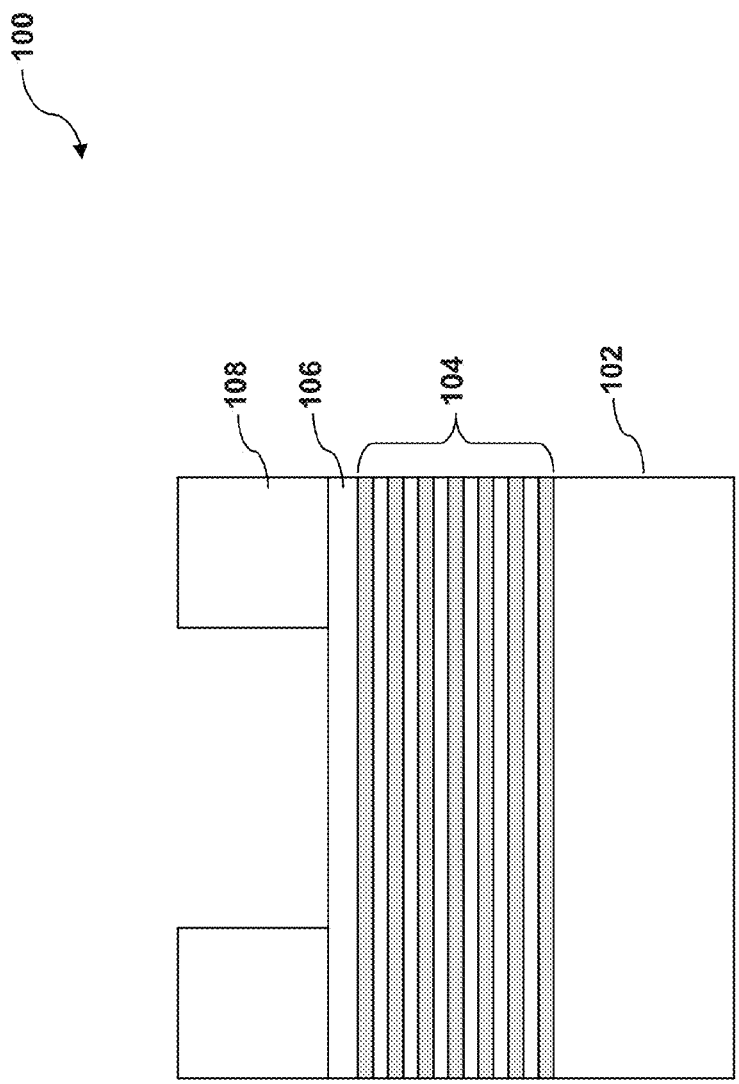
FIGS. 2, 3, 4, and 5 are sectional views of a reflective mask used in an extreme ultraviolet (EUV) lithography exposing tool, constructed in accordance with some embodiments.

In the present embodiment, the mask is a reflective mask to be used in an extreme ultraviolet (EUV) lithography. An exemplary reflective mask 100 is illustrated in FIG. 2 in a sectional view. The reflective mask 100 includes a substrate 102, a reflective multilayer (ML) 104 deposited on the substrate 102, a capping layer 106 deposited on the reflective ML 104, and a patterned absorption layer 108 deposited on the capping layer 106. The mask 100 may further include a protection layer deposited on the patterned absorption layer 108. It is understood that other configurations and inclusion or omission of various items in the mask 100 may be possible. The mask 100 and the method making the same are further described below.

In some embodiments, the substrate 102 includes a low thermal expansion material (LTEM). The substrate 102 serves to minimize image distortion due to mask heating by the intensified illumination radiation. The LTEM may include fused silica, fused quartz, calcium fluoride ($CaF_2$), silicon carbide, silicon oxide-titanium oxide alloy and/or other suitable LTEM known in the art. The substrate 102 includes materials with a low defect level and a smooth surface.

The reflective ML 104 is deposited on the substrate 102. According to Fresnel equations, light reflection occurs when light propagates across the interface between two materials of different refractive indices. The reflected light is greater when the difference of refractive indices is greater. To increase the reflected light, one may also increase the number of interfaces by depositing the reflective ML 104 of alternating materials and let light reflected from different interfaces interfere constructively by choosing appropriate thicknesses for each layer of the reflective ML 104. However, the absorption of the reflective ML 104 limits the highest reflectivity that can be achieved. The reflective ML 104 includes a plurality of film pairs, such as molybdenum-silicon (Mo/Si) film pairs (e.g., a layer of molybdenum above or below a layer of silicon in each film pair). Alternatively, the reflective ML 104 may include molybdenum-beryllium (Mo/Be) film pairs, or any material that is highly reflective at EUV wavelengths can be utilized for the reflective ML 104. The thickness of each layer of the reflective ML 104 depends on the EUV wavelength and the incident angle. The thickness of the reflective ML 104 is adjusted to achieve a maximum constructive interference of the EUV light reflected at each interface and a minimum absorption of the EUV light by the reflective ML 104. The reflective ML 104 may be selected such that it provides a high reflectivity to a selected radiation type/wavelength. A typical number of film pairs are 20-80, however any number of film pairs is possible. In some embodiments, the reflective ML 104 includes forty pairs of layers of Mo/Si. In one example, each Mo/Si film pair has a thickness of about 7 nm, with a total thickness of 280 nm, and thereby a reflectivity of about 70% is achieved.

The capping layer 106 is deposited on the reflective ML 104. Because the capping layer 106 has different etching characteristics from an absorption layer, the capping layer 106 acts as an etch stop layer in a subsequent patterning or a repairing process of the absorption layer, which will be described later. The capping layer 106 includes ruthenium (Ru) or alternatively Ru compounds, such as ruthenium-boron (RuB) or ruthenium-silicon (RuSi).

The absorption layer 108 is deposited on the capping layer 106 and then is patterned to form the main pattern according to an IC design layout. In some embodiments, the absorption layer 108 absorbs a radiation beam projected on it. The absorption layer 108 can include a single layer or multiple layers from a group of tantalum boron nitride (TaBN), chromium (Cr), chromium oxide (CrO), titanium nitride (TiN), tantalum nitride (TaN), tantalum (Ta), titanium (Ti), or aluminum-copper (Al—Cu), palladium, aluminum oxide (AlO), molybdenum (Mo), or other suitable materials. The patterning of the absorption layer 108 includes a lithography patterning process and etching. The lithography patterning process further includes forming a resist layer sensitive to the EUV light by spin-on coating; exposing the resist layer using electron-beam (e-beam) in a proper mode, such as direct e-beam writing; and developing the exposed resist layer to form a patterned resist layer that includes a plurality of openings defining a circuit pattern. The lithography patterning process may include other operations, such as post-exposure baking (PEB). An etching process is applied to the absorption layer 108 through the openings of the patterned resist layer to pattern the absorption layer 108 using the patterned resist layer as an etch mask. Afterward, the patterned resist layer is removed by plasma ashing or wet stripping.

Figure 3:
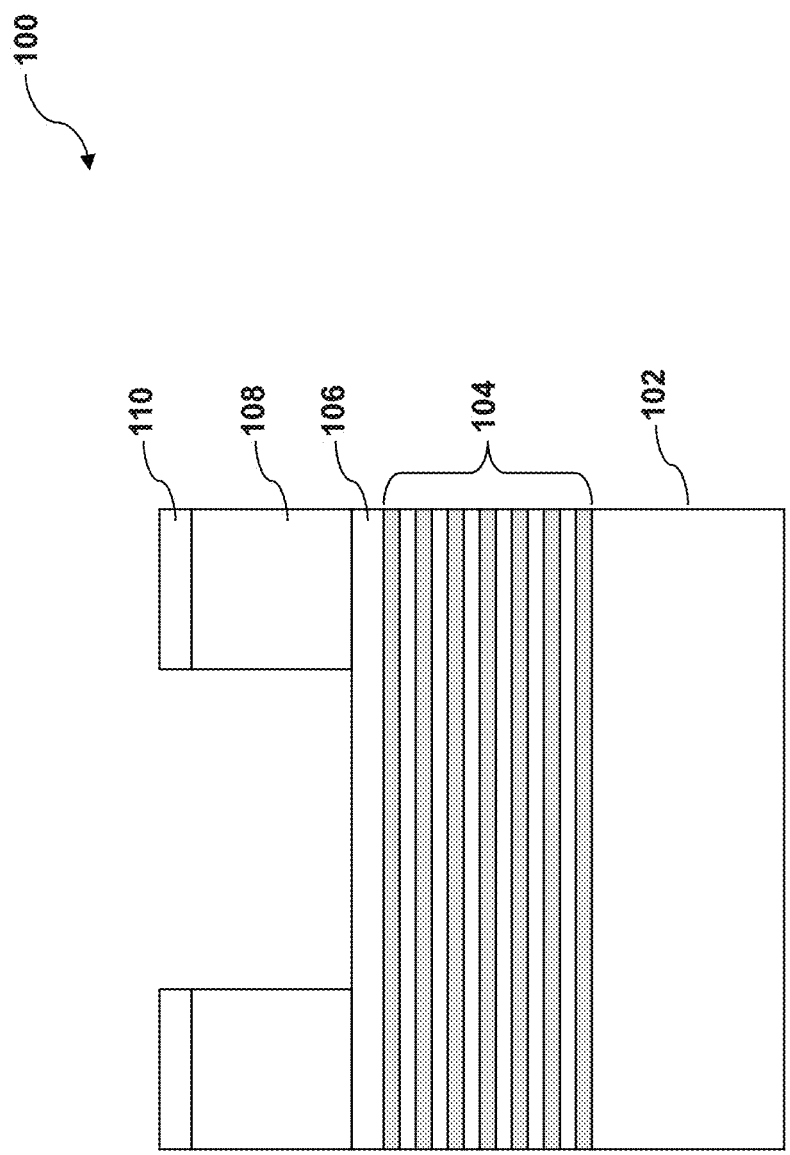

In some embodiments, the mask 100 may further include a protection layer 110 deposited on the absorption layer 108, as illustrated in FIG. 3. In some embodiments, the protection layer 110 may protect the absorption layer 108 from an oxidation of the high absorption layer 108 when the mask is in a cleaning process. Furthermore, some of the absorption layer 108 has poor clean resistance and the protection layer 110 can enhance the cleaning durability.

Figure 4:
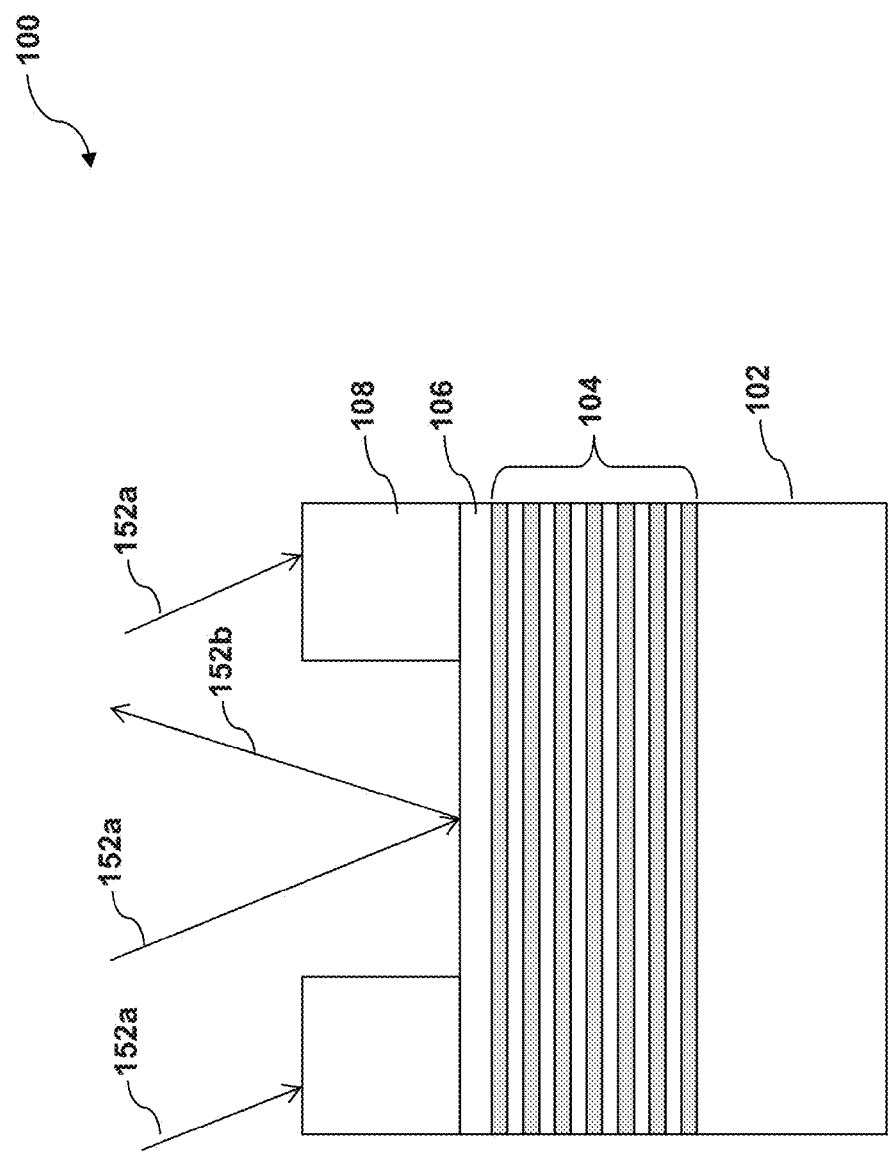

The mask 100 is used in a lithography exposing process when patterning a semiconductor wafer. As shown in FIG. 4, when an illumination beam 152a is projected on the mask 100, a portion of the illumination beam 152a projected on the absorption layer 108 is absorbed by the absorption layer 108 and another portion of the illumination beam 152a projected on the reflective ML 104 is reflected by the reflective ML 104. A patterned illumination beam 152b is thereby generated. The patterned illumination beam 152b is used to expose a resist film coated on a semiconductor wafer. With following other lithography operations, such as PEB and developing, a resist pattern is formed on the wafer and is able to be used as an etch mask during an etching process or as an implantation mask during an ion implantation.

One challenge of using a reflective EUV lithography technique occurs when a defect appears in/on a reflective EUV mask. While a relatively small defect may not be significantly detrimental when using a transmissive mask, a similar defect may be significant when using a reflective EUV mask for various factors, such as reduced feature sizes of the circuit pattern on the mask 100. Therefore, a quality or integrity of the corresponding exposed image is impacted by the defect on the mask 100.

Referring back to FIG. 1, the method 50 includes an operation 54 by inspecting the mask 100 to identify one or more defect using a mask inspection tool, such as an optical inspection tool, an atomic force microscope (AFM) or other suitable inspection tool. Inspecting the mask 100 includes scanning a surface of the mask, locating a defect on the mask, and determining the shape and the size of the defect.

The defects on the mask include two types of defect: hard defects and soft defects. The hard defects refer to the defects that cannot be removed by a cleaning process. In the present embodiments, the hard defects includes defect of the absorption layer 108. For example, In FIG. 5, a portion 120 of the absorption layer 108 is supposed to be removed according to the circuit pattern during the patterning process to pattern the absorption layer 108 but remains on the mask 100. The portion 120 of the absorption layer 108 is a hard defect since it deforms the circuit pattern defined on the mask 100. The hard defect may also include other defects such as defects in the reflective ML 104, such as a bump or a dip in the reflective ML 104.

Figure 5:
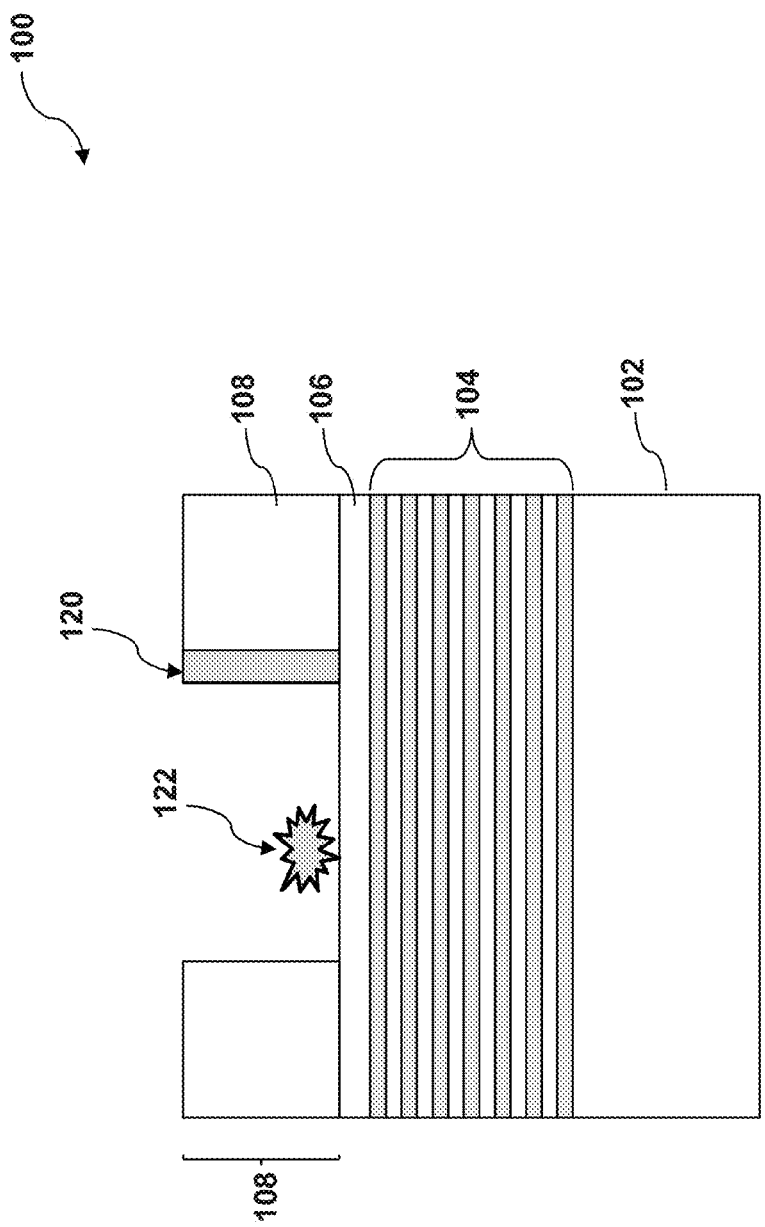

The soft defects refer to defects that can be removed by the cleaning process, such as particles and resist residue. FIG. 5 illustrates an exemplary soft defect 122 formed on the reflective ML 104 (or specifically on the capping layer 106). The inspection of the mask 100 in the operation 54 is designed to identify hard defects on the mask for its location, size, and shape. In one example, by the inspection, the hard defects on the mask 100 are mapped and used in the repairing operation.

The method 50 proceeds to an operation 56 by performing a cleaning process to the mask 100, thereby removing the soft defects. The cleaning process includes applying a sulfuric peroxide mixture (SPM) to the mask 100. The SPM is a solution including sulfuric acid, hydrogen peroxide and water. The challenge is, when SPM is applied to the mask 100, the cleaning process introduces additional defects to the mask 100, even the damaging the mask 100. The root cause is identified through our experiments and analysis.

The experiments found that the mask 100, especially the capping layer 106 of the mask 100, is damaged after the cleaning process. For example, the capping layer 106 of ruthenium is damaged (such as cracking) or even removed after the cleaning process. This is related to the characteristics of the SPM chemical. When the sulfuric acid and hydrogen peroxide are mixed to form the SPM, there is an exothermic effect. In other words, the heat is generated during the mixing.

As shown by a chemical reaction equation 124 in FIG. 6, when sulfuric acid ($H_2SO_4$) and hydrogen peroxide ($H_2O_2$) are mixed, the reaction occurs to form $H_2SO_5$ and water ($H_2O_2$). In a chemical reaction equation 126, $H_2SO_5$ is further reacted with the soft defect (such as organic chemical $C_xH_x$) to form $CO_2$, $H_2SO_4$ and $H_2O$, thereby removing the soft defect. The first chemical reaction 124 is an exothermic reaction, generating heat in the mixed solution. In one embodiment, the sulfuric acid is a sulfuric acid solution of about 98% $H_2SO_4$ and a fraction of water; and the hydrogen peroxide is a solution of $H_2O_2$ and water with about 30% of $H_2O_2$ in volume. When the sulfuric acid solution and the hydrogen peroxide solution are mixed, the enthalpy difference $\Delta H$ is about $-880$ kJ/mol. This reaction is spontaneous and the generated heat immediately increases the temperature of the SPM from the room temperature to about 120° C.

Figure 7:
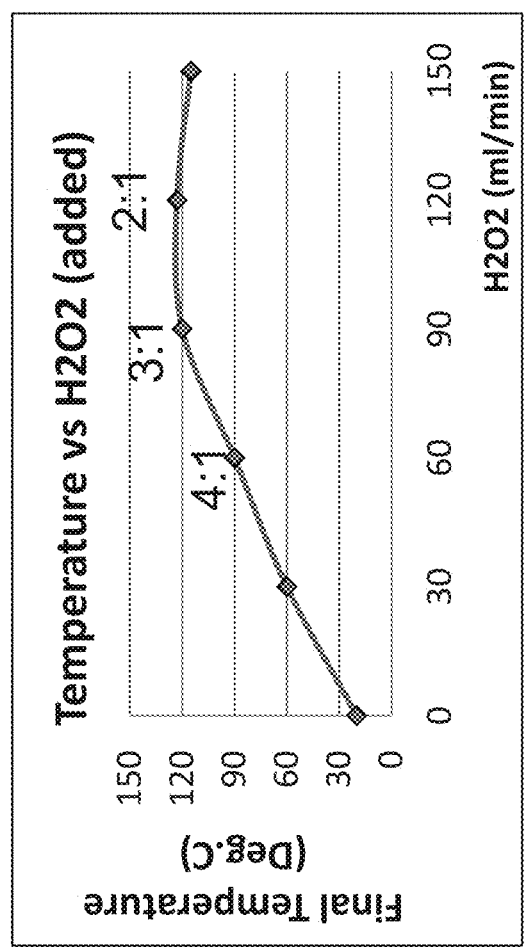
FIG. 7 illustrates a curve and data associated with the cleaning process, constructed according to various embodiments.

The heating effect from the mixing of sulfuric acid and hydrogen peroxide is further illustrated in FIG. 7 based on the experiment data. In FIG. 7, the horizontal axis represents a rate of adding hydrogen peroxide to sulfuric acid in a unit, such as ml/min. The vertical axis represents the final temperature of the mixed SPM solution. The sulfuric acid and hydrogen peroxide are mixed with a $H_2SO_4/H_2O$ volume ratio ranging from 4:1 to 2:1. The curve and the data show the mixed SPM temperature can reach as high as about 120° C.

When heated SPM is applied to the mask 100, the fast heating effect causes the stress to the capping layer 106 due to different thermal expansions, therefore causing the cracking of the capping layer 106. In order to verify the cracking of the capping layer 106 is the fast heating effect, an experiment was carried by immersing the mask into hot water of about 60° C. There is no other chemical in the hot water, the cracking of Ru capping layer is observed. This indicates the cracking of the Ru layer is the result of the fast heating instead of chemical reaction effect. While mixed SPM solution has been heated up to about 120° C., the cracking is even more serious.

Figure 8:
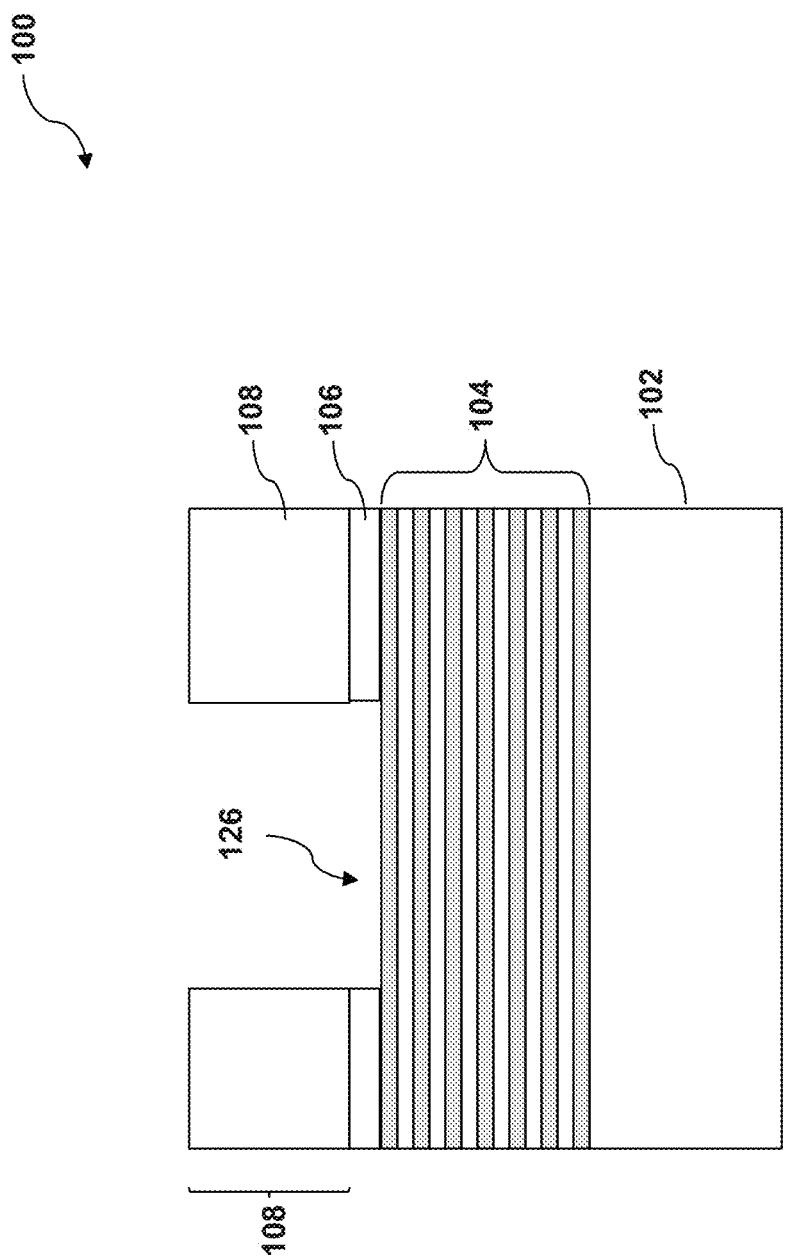
FIG. 8 is a sectional view of a reflective mask used in a EUV lithography exposing tool, constructed in accordance with some embodiments.

Furthermore, the chemical $H_2SO_5$ is not only reacted with organic chemical for cleaning effect but also oxidize Ru, forming Ru oxide. The Ru oxide is further removed during the cleaning process, causing the capping layer 106 (the portion uncovered by the absorption layer) to be removed during the repairing process, as illustrated in FIG. 8. The uncovered portion of the capping layer 106 is removed after the repairing process, causing an additional damage 126 to the mask.

Figure 9:
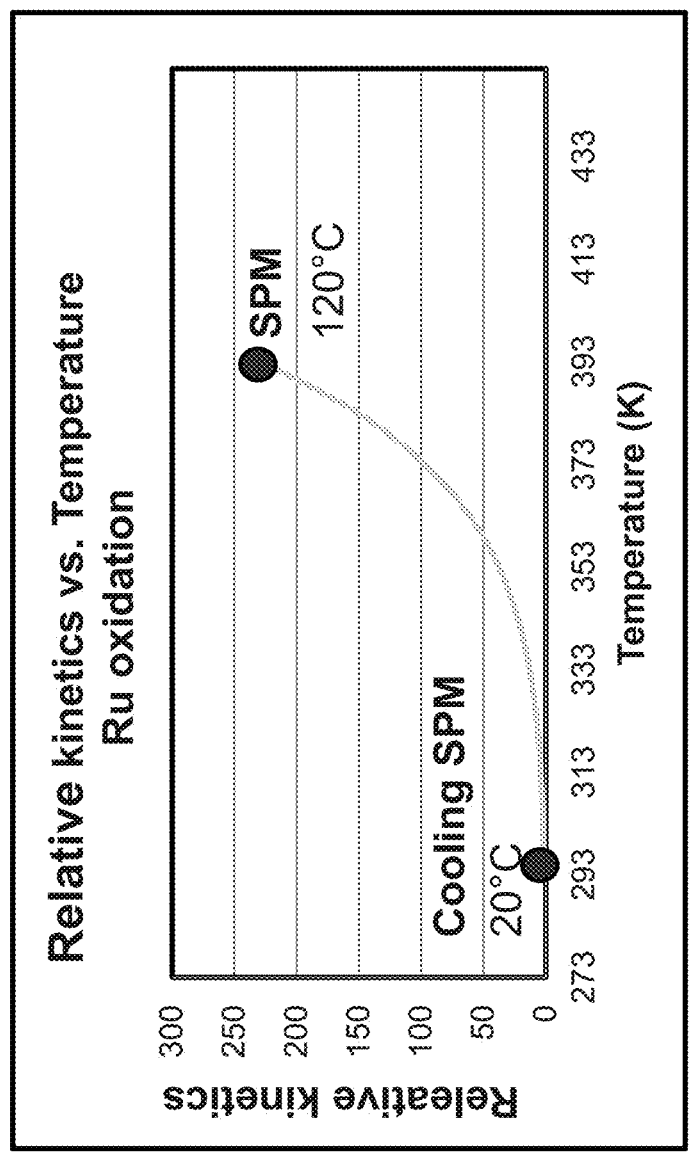
FIG. 9 illustrates a curve and data associated with the cleaning process, constructed in accordance with some embodiments.

The fast heating effect leads to hot SPM solution. As a synergetic effect, the Ru oxidation by $H_2SO_5$ is substantially increased at the high temperature, which leads to even more damages to the capping layer 106. This is further illustrated in FIG. 9. In FIG. 9, the horizontal axis represents the temperature of the SPM solution in absolute temperature (K) and the vertical axis represents the reaction rate k of chemical reaction. In this example, the chemical reaction is the oxidation of the capping layer by the SPM solution. The reaction rate k exponentially depends on the temperature according to Arrhenius equation, $k = Ae^{-Ea/RT}$. In the equation, Ea is the activation energy, R is the gas constant and T is the temperature. As shown in FIG. 9, the higher the temperature is, the greater the reaction rate is. Particularly, the reaction rates k1 and k2 at two temperatures T1 and T2, respectively, are related by the following formula, $$\ln\frac{k2}{k1} = \frac{Ea}{R}\left(\frac{1}{T1} - \frac{1}{T2}\right)$$

When T1 and T2 are chosen to be 20° C. and 120° C., respectively, it is found, according to the above formula, that the ratio of the reaction rates at the two temperatures can be as high as 200. That means, when the temperature of the SPM solution is chilled from 120° C. to the room temperature, the reaction rate can be slowed down by a factor 1/200.

The cooling the SPM solution can substantially decrease the oxidation of the capping layer. It seems that gradually cooling down the mixed SPM solution on the shelf may solve the problem. However, it is also found that the cleaning effect of the SPM solution depends on the freshness of the mixed SPM solution. The cooling duration is a crucial factor. The long time cooling process degrades the mixed SPM solution and decreases the cleaning effect.

The disclosed method and the system provide an effective approach. Particularly, the mixed SPM solution is fast cooled to a working temperature using a cooling module, such that the SPM solution is fresh and cool, which is referred to as non-thermal SPM solution. A cleaning apparatus 130 is illustrated in FIG. 10 as a schematic view, constructed in accordance with some embodiments.

Figure 10:
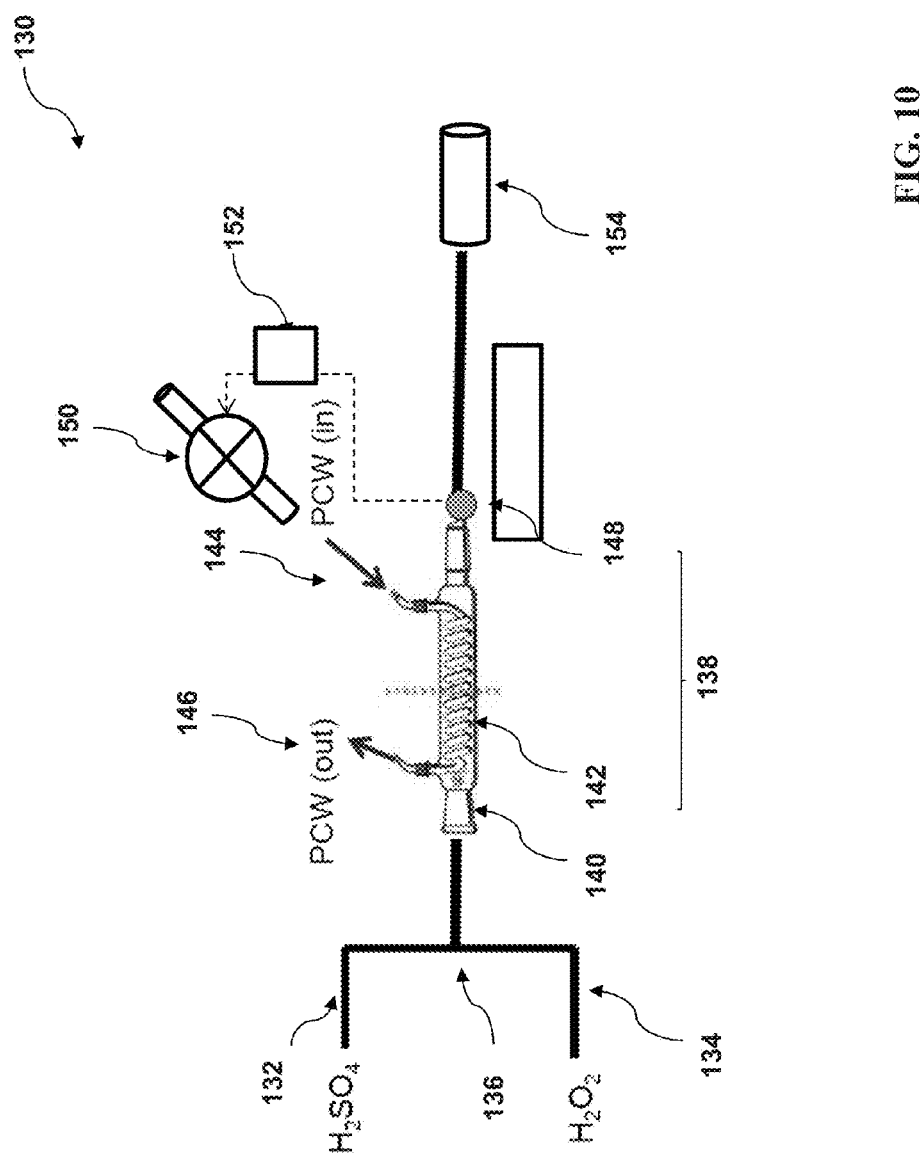
FIG. 10 illustrates a schematic view of a cleaning apparatus constructed in accordance with some embodiments.

Referring to FIG. 10, the cleaning apparatus 130 includes a first chemical path 132 connected with a sulfuric acid supply and a first chemical path 134 connected with a hydrogen peroxide supply. In some examples, the first path 132 and the second path 134 include hoses and control units. The hoses are made of a material that resists the chemical erosion and chemical reaction, and have sizes for proper flow. The control units, such as valves, are configured in the respective paths, are designed to control the flow rates of the respective chemicals such that the sulfuric acid and hydrogen peroxide are mixed at proper volume ratio or concentration. The cleaning apparatus 130 also includes a joint mechanism 136 so that the first path and second path joined together and sulfuric acid and hydrogen peroxide are mixed there freshly. In one example, the joint mechanism 136 includes a Y joint structure. In another example, the joint mechanism 136 may include other control mechanism, such as valve, to control the flow of the mixed SPM solution. As described above, the mixed SPM solution generates heat energy and heats up the mixed SPM solution to a high temperature (as high as 120° C. in one example). The joint mechanism 136 is further coupled with a cooling unit 138 such that the mixed SPM solution is chilled to the working temperature after flowing through the cooling unit 138. The cooling unit has a fast cooling mechanism that is capable of chilling the mixed SPM solution quickly to the working temperature. In some embodiments, the cooling unit 138 uses process cooling water (PCW) with a temperature below the room temperature. In one example, the working temperature is below the room temperature or below 25° C. In other embodiments, the working temperature ranges between 4° C. and 25° C.

Figure 11:
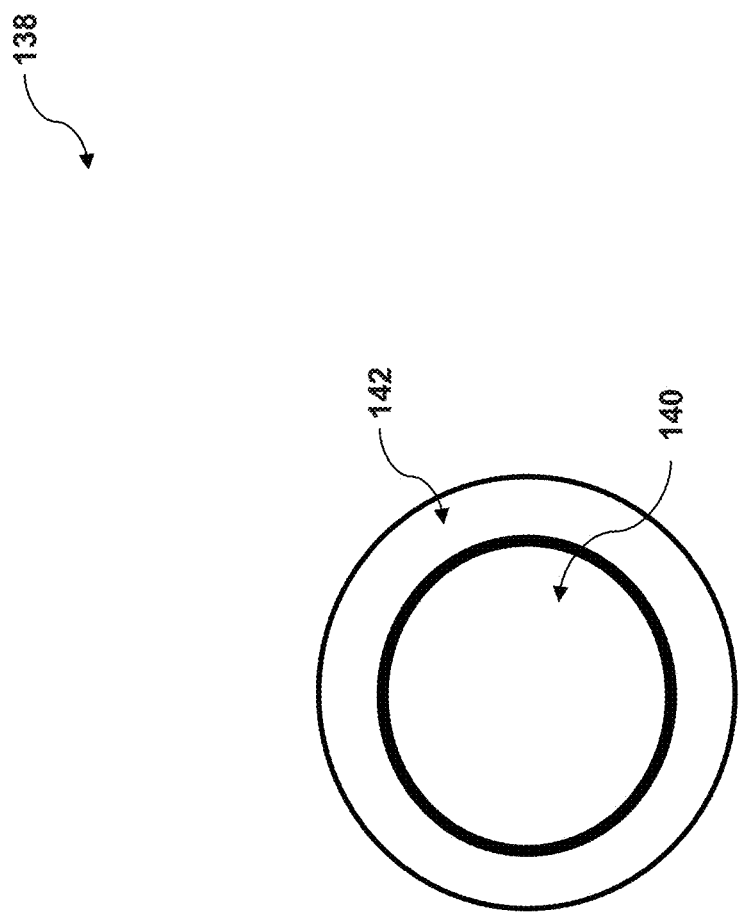
FIG. 11 illustrates a sectional view of a cooling unit in the cleaning apparatus of FIG. 10 constructed in accordance with some embodiments.

FIG. 11 illustrates the cooling unit 138 in a cross-sectional view, constructed in accordance with some embodiments. The cooling unit 138 is further described with reference to FIGS. 10 and 11. The cooling unit 138 includes an inner tube 140 connected to the joint mechanism 136 so the mixed SPM solution flows through. The cooling unit 138 also includes an outer spiral tube 142 configured surrounding the inner tube 140. The outer spiral tube 142 is connected to the process cooling water such that the process cooling water is flow through the outer spiral tube 142. The outer spiral tube 142 is designed and configured to enable sufficient thermal transportation between the inner tube 140 and the outer spiral tube 142 so that the mixed hot SPM solution is chilled down to the working temperature after the mixed SPM solution flows out of the cooling unit 138. For example, the material of the cooling unit 138 and the dimension of the cooling unit from the inner tube 140 to the outer spiral tube 142 are designed to optimize the thermal coupling between the two tubes. In the present embodiment, the cooling unit 138 is made of quartz that is resist to the sulfuric acid from erosion. Other parameters are also factors in the consideration of the design. The flow rates of the PCW, the sectional area of the outer spiral tube, the contact area between the two tubes, thermal conductivity of the material (quartz in the present example), the flow rates of the mixed SPM solution, the sectional area of the inner tube, and the initial temperature of the PCW are also considered and optimized such that the mixed SPM solution can be chilled down to the working temperature. In other embodiments, the outer tube 142 may have other design instead of the spiral design to optimize the thermal coupling between the SPM solution and the PCW.

Back to FIG. 10, the outer spiral tube 142 also includes an inlet 144 connected to the PCW supply and an outlet 146. The outlet 146 may be connected to the exhaust or connected back to the PCW supply so the PCW can be repeated used in a closed cycle mode.

The cleaning apparatus 130 also includes a temperature sensor 148 configured to monitor the temperature of the mixed SPM solution after flowing out of the cooling unit 138 to ensure the working temperature is reached.

In some embodiments, the cooling mechanism of the cooling unit 138 further includes a feedback mechanism to ensure the working temperature is reached. Particularly, a flow rate control mechanism 150, such as a valve, is configured in the path between the PCW supply and the inlet 144 to control the flow rate of the PCW through the outer spiral tube 142. The flow arte control mechanism 150 is coupled with the temperature sensor 148, such as through a control module 152. The control module 152 is operable to adjust the flow rate of the PCW by adjusting the flow rate control mechanism 150 according to the monitored temperature of the SPM solution. In one example, the control module 152 controls the flow rate control mechanism 152 according to the difference between the working temperature and the monitored temperature. Particularly, during the cleaning process, if the monitored temperature is below the working temperature, the control module 152 adjusts the flow rate control module 150 to a higher level such that the heat transportation is enhanced and the temperature of the SPM is further reduced to reach the working temperature. The control module 152 may include a circuit, such as an analog signal processor.

Referring back to FIG. 1, the operation 56 is designed to effectively address the issues identified above. In the operation 56, the SPM solution is cooled down with PCW using the cooling unit 138 to form the non-thermal cleaning solution that has a working temperature below the room temperature. The cleaning apparatus 130 further includes a nozzle 152 connected to the cooling unit 138 and configured to spray the non-thermal SPM solution to the mask 100.

During the operation 56, the flow rate of the PCW is controlled to adjust the heat transportation such that the working temperature can be reached. During the operation 56, the feedback loop including the temperature sensor 148, the flow rate control mechanism 150 and the control module 152 are coupled to control the temperature of the SPM solution in a real time, according to some embodiments. In other embodiments, other parameter(s), such as the temperature of the PCW, flow rate of the SPM solution, may be controlled in the feedback loop such that the working temperature can be reached.

Particularly, the operation 56 includes following sub-operations. The operation 56 includes a first sub-operation 72 by mixing sulfuric acid and hydrogen peroxide to form a SPM solution at the joint mechanism 136. The operation 56 includes a second sub-operation 74 by cooling down the SPM solution to the working temperature by the cooling unit 138, thereby forming a non-thermal sulfuric peroxide mixture. Thereafter, the operation 56 further includes a sub-operation 76 by applying the non-thermal cleaning solution to the mask for effective cleaning without damaging the mask.

By implementing the operation 56 using the cleaning apparatus 130, the non-thermal cleaning solution is formed cool and fresh. During the cleaning process, the oxidation of and cracking of the capping layer 106 are substantially reduced or eliminated while cleaning effectiveness is substantially remained. The further experiments indicate that the even the cleaning effect may be a little bit reduced but the side effects (such as cracking and removal of the capping layer) are substantially reduced or eliminated.

The method 50 includes an operation 56 by repairing the mask to remove the hard defects. In some embodiments, repairing the defect includes using a radiation beam, such as an electron beam or an ion beam to heat the bump defect and smooth the bump defect and the surrounding area. In other embodiments, repairing the defect includes scooping the pit defect and depositing a patch by a deposition process, such as a chemical vapor deposition (CVD).

In some embodiments, the repairing process includes a localized etching process such that the hard defects are removed thereby without damaging the mask 100. The repairing process is implemented to remove the hard defects according to the mapped hard defects identified by the operation 54. In some embodiments, the repairing process includes an electron-beam-induced etching process. When the electron-beam is directed to the hard defects according to the mapped hard defects. In one example, the repairing process includes an electron-beam-induced etching process using xenon difluoride (XeF2) as the precursor. The etch rate to the absorption layer 108 by XeF2 is substantially enhanced by the electron-beam, therefore, the etching process is localized to the regions the electron-beam is directed.

Figure 12:
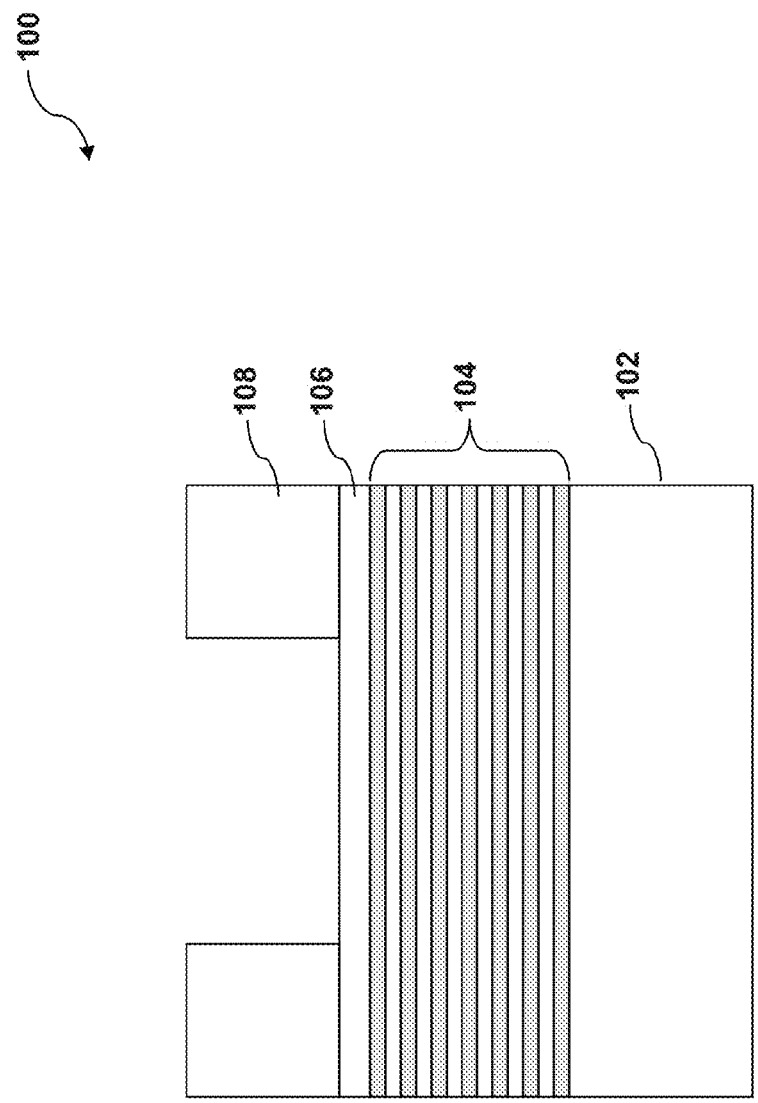
FIG. 12 is a sectional view of a reflective mask used in a EUV lithography exposing tool, constructed in accordance with some embodiments.

After the operations 56 and 58, both hard defects and soft defects are removed without damaging the mask 100, as illustrated in FIG. 12. Particularly, the capping layer 106 remains intact since the Ru oxidation and Ru cracking are reduced or eliminated. It is noted the method 50 is described mostly with reference to the mask 100. However, the mask 100 may include other films and features. In one example, the mask 100 may additionally include the protection layer 110 as illustrated in FIG. 3. In other example, the mask 100 may further include a conductive layer of a metal or metal alloy, such as chrome nitride, coated on the backside of the mask 110. In other examples, the mask 110 may be a phase shift mask having another reflective layer. In furtherance of the examples, the absorption layer 108 is replaced with a second reflective layer patterned to define a circuit design. The second reflective layer may be similar to the reflective ML 104 in terms composition and structure, or alternatively different with reduced thickness to avoid other side effect, such as shadowing effect.

The method 50 may also include another inspection operation 60 to further check if the mask 100 is cleaned to meet the specification of the mask. Otherwise, the method 50 may return back to repeat the operation 56 for cleaning and the operation 58 for repairing.

The method 50 may further include other operations. For example, a pellicle may be amounted on the mask 100 for protection before being shipped to the semiconductor manufacture for use in lithography exposing processes to pattern wafers. The method 50 may also include performing a lithography exposing process using the mask 110 to pattern a wafer. During the use the mask 110 in the lithography exposing process, the mask 100 may be further cleaned using the operation 56 and the cleaning apparatus 130 if new defect is found. The use of the mask 110 to pattern the semiconductor wafers is further described below.

Figure 13:
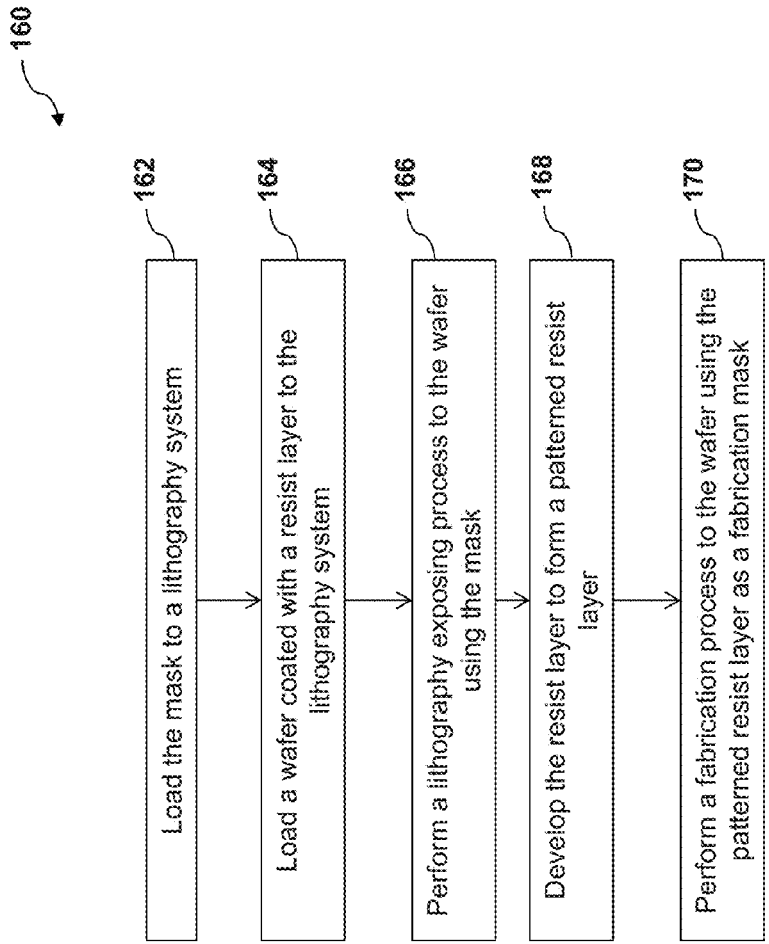
FIG. 13 is a flowchart of a method for using the mask of FIG. 2 in accordance with some embodiments.

FIG. 13 provides a flowchart of a method 160 for fabricating a semiconductor structure in accordance with various embodiments of the present disclosure. It is understood that additional operations may be implemented before, during, and after the method 160, and some steps described can be replaced, eliminated, or moved around for additional embodiments of the method. The method 160 and a semiconductor wafer 200 made by the method 160 are concurrently described with reference to FIGS. 13-18. The method 160 is an example, and is not intended to limit the present disclosure beyond what is explicitly recited in the claims.

The method 160 begins at operation 162 by loading the mask 110 into a lithography system. Particularly, the lithography system is a EUV lithography system designed to expose a resist layer by EUV light. The resist layer is a suitable material sensitive to the EUV light. The EUV lithography system includes a radiation source to generate EUV light, such as EUV light having a wavelength ranging between about 1 nm and about 100 nm. In one particular example, the radiation source generates a EUV light with a wavelength centered at about 13.5 nm. The lithography system also includes an illuminator. In various embodiments, the illuminator includes various reflective optic parts, such as a single mirror or a mirror system having multiple mirrors, to direct light from the radiation source onto a mask stage. The lithography system includes a mask stage configured to secure the mask 100. In some embodiments, the mask stage includes an electrostatic chuck (e-chuck) to secure the mask. The lithography system also includes a projection optics module (or projection optics box (POB) for imaging the pattern of the mask 100 on to a semiconductor substrate secured on a substrate stage of the lithography system. In the present embodiment, the POB has reflective optics for projecting the EUV light. The EUV light, which carries the image of the pattern defined on the mask, is directed from the mask and is collected by the POB. The illuminator and the POB are collectively referred to an optical module of the lithography system. The lithography system also includes a substrate stage to secure the semiconductor substrate.

Referring to FIG. 13, the method 160 also includes an operation 164 by loading a semiconductor wafer 200 on the wafer stage of the lithography system. FIG. 14 illustrates a semiconductor wafer 200 in a sectional view. The semiconductor wafer 200 is coated with a resist layer 202 sensitive to the EUV beam. In the present embodiment, the semiconductor wafer 200 is a silicon wafer or alternatively includes other semiconductor material. In some embodiments, the semiconductor wafer 200 includes another elementary semiconductor, such as germanium; a compound semiconductor including silicon carbide, gallium arsenic, gallium phosphide, indium phosphide, indium arsenide, and/or indium antimonide; or an alloy semiconductor including SiGe, GaAsP, AlInAs, AlGaAs, GaInAs, GaInP, and/or GaInAsP. In yet another alternative, the semiconductor wafer 200 includes a semiconductor on insulator (SOI) structure. In other embodiments, the semiconductor wafer 200 also includes one or more conductive and/or dielectric films. In some embodiments, the dielectric film may include silicon oxide, high k dielectric material film, or a combination of silicon oxide and high k dielectric material, and the conductive thin film for the gate electrode film may include doped polysilicon, or a metal, such as aluminum (Al), copper (Cu), tungsten (W), nickel (Ni), titanium (Ti), gold (Au), platinum (Pt) or alloy of the metals thereof.

Referring to FIGS. 13 and 15, the method 160 includes an operation 166 by performing a lithography exposing process to the resist layer 202 using the mask 100 in the EUV lithography system. During the operation 166, the generated EUV radiation is illuminated on the mask 100 (by the illuminator), and is further projected on the resist layer 202 coated on the wafer 200 (by the POB), thereby forming a latent image on the resist layer. In some embodiments, the lithography exposing process is implemented in a scan mode.

Referring to FIGS. 13 and 16, the method 160 may include an operation 168 by developing the exposed resist layer to form a patterned resist layer 204 having a plurality of openings defined thereon. In one example, the resist layer is positive tone; the exposed portion of the resist layer is removed by the developing solution. In another example, the resist layer is negative tone; the exposed portion of the resist layer remains; and the non-exposed portion is removed by the developing solution.

Referring to FIGS. 13 and 17, the method 160 may include other operations. Particularly, the method 160 includes a fabrication process 170 applied to the semiconductor wafer through the openings of the patterned resist layer 204 using the patterned resist layer as a fabrication mask. In one example, the fabrication process includes applying an etch process to the semiconductor wafer 200 or a material layer on the semiconductor substrate using the resist pattern as an etch mask. In furtherance of the example, the semiconductor wafer 200 is patterned to form various trenches 206, as illustrated in FIG. 18. In another example, the fabrication process includes performing an ion implantation process to the semiconductor wafer 200 using the patterned resist layer as an implantation mask. After the operation 170, the resist layer may be removed by wet stripping or plasma ashing, as illustrated in FIG. 18.

The present disclosure provides a cleaning apparatus 130 and the method 50 to fabricate the mask 100. Particularly, the method 50 is designed to effectively clean and remove the defects from the mask 100. The method 50 includes an operation 56 by applying the non-thermal cleaning solution to the mask. The non-thermal cleaning solution has a working temperature below the room temperature. The cleaning apparatus 130 includes a cooling unit 138 using process cooling water. In some embodiments, the cooling unit 138 includes a feedback loop to effectively control the temperature of the SPM solution to form the non-thermal cleaning solution. By implementing the operation 56 using the cleaning apparatus 130, the non-thermal cleaning solution is formed to be cool and fresh. During the cleaning process, the oxidation of and cracking of the capping layer 106 are substantially reduced or eliminated while cleaning effectiveness is substantially remained.

Thus, the present disclosure provides a method of repairing a mask in accordance with some embodiments. The method includes inspecting a mask to identify a defect on the mask; performing a cleaning process to the mask using a non-thermal chemical solution to the mask; and repairing the mask to remove the defect from the mask. The non-thermal chemical solution is cooled by a cooling module to a working temperature below room temperature.

The present disclosure provides a method of fabricating a mask in accordance with some embodiments. The method includes mixing sulfuric acid and hydrogen peroxide to form a sulfuric peroxide mixture; cooling the sulfuric peroxide mixture to form a non-thermal sulfuric peroxide mixture; and applying the non-thermal sulfuric peroxide mixture to a mask, thereby cleaning the mask.

The present disclosure provides a cleaning apparatus in accordance with some embodiments. The cleaning apparatus includes a first path connected to a first chemical supply of sulfuric acid; a second path connected to a second chemical supply of hydrogen peroxide; a joint mechanism to mix the sulfuric acid from the first path and the hydrogen peroxide from the second path, thereby forming a sulfuric peroxide mixture; a cooling module configured to cool the sulfuric peroxide mixture to a non-thermal sulfuric peroxide mixture; and a nozzle connected the joint mechanism and designed to apply the non-thermal sulfuric peroxide mixture to a mask.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of repairing an exposure mask, the method comprising:
   inspecting the mask to identify a defect on the mask;
   performing a cleaning process to the mask using a non-thermal chemical solution to the mask, wherein the non-thermal chemical solution is cooled by a cooling module to a working temperature below room temperature; and
   repairing the mask to remove the defect from the mask.

2. The method of claim 1, wherein the performing of the cleaning process to the mask includes:
   mixing sulfuric acid and hydrogen peroxide to form a sulfuric peroxide mixture;
   cooling the sulfuric peroxide mixture to form a non-thermal sulfuric peroxide mixture using the cooling module; and
   applying the non-thermal sulfuric peroxide mixture to the mask.

3. The method of claim 2, wherein the cooling of the sulfuric peroxide mixture to form the non-thermal sulfuric peroxide mixture includes cooling the sulfuric peroxide mixture to form the non-thermal sulfuric peroxide mixture with a working temperature ranging between 4° C. and 15° C.

4. The method of claim 2, wherein the cooling of the sulfuric peroxide mixture to form the non-thermal sulfuric peroxide mixture includes cooling the sulfuric peroxide mixture by a cooling water having a temperature below room temperature.

5. The method of claim 4, wherein the cooling module includes an inner tube and an outer spiral tube surrounding the inner tube, wherein the inner tube and outer spiral tube are made of quartz and designed to be thermally coupled for sufficient heat transportation between the inner tube and the outer spiral tube.

6. The method of claim 5, wherein the cooling of the sulfuric peroxide mixture to form the non-thermal sulfuric peroxide mixture includes:
   flowing the sulfuric peroxide mixture to the inner tube; and
   simultaneously flowing the cooling water to the outer spiral tube such that the non-thermal sulfuric peroxide mixture is cooled to a working temperature below the room temperature.

7. The method of claim 6, wherein the cooling of the sulfuric peroxide mixture to form the non-thermal sulfuric peroxide mixture further includes adjusting a flow rate of the cooling water such that the non-thermal sulfuric peroxide mixture is cooled to the working temperature before the applying the non-thermal sulfuric peroxide mixture to the mask.

8. The method of claim 2, wherein the repairing of the mask includes applying an electron-beam and xenon difluoride ($XeF_2$) to remove a portion of an absorption layer of the mask; and
   wherein the applying of the non-thermal sulfuric peroxide mixture to the mask includes spraying the non-thermal sulfuric peroxide mixture to the mask through a nozzle.

9. The method of claim 1, wherein the mask is an extreme ultraviolet (EUV) mask that includes a low thermal expansion material (LTEM) substrate, reflective multiple layers (ML) deposited on the LTEM substrate, a capping layer of ruthenium (Ru) on the ML, and an absorption layer on the capping layer.

10. The method of claim 9, wherein the EUV mask includes a mask selected from the group consisting of a binary mask and a phase shift mask.

11. A method of repairing an exposure, the method comprising:
    identifying a first defect on the mask;
    mixing sulfuric acid and hydrogen peroxide to form a sulfuric peroxide mixture having a first temperature;
    cooling the sulfuric peroxide mixture to form a non-thermal sulfuric peroxide mixture having a second temperature; and
    applying the non-thermal sulfuric peroxide mixture to the mask to thereby remove the first defect from the mask.

12. The method of claim 11, wherein the first temperature is at least 25° C. and the second temperature is less than 25° C.

13. The method of claim 11, wherein the first temperature is about 120° C. and the second temperature is less than 25° C.

14. The method of claim 11, wherein cooling the sulfuric peroxide mixture to form the non-thermal sulfuric peroxide mixture having the second temperature includes cooling the sulfuric peroxide mixture by passing the sulfuric peroxide mixture through a cooling water module.

15. The method of claim 14, wherein the cooling water module includes:
- an inner tube configured to pass the sulfuric peroxide mixture therethrough; and
- an outer tube surrounding the inner tube and configured to pass cooling water therethrough.

16. The method of claim 11, further comprising:
identifying a second defect on the mask; and
applying an electron beam to the mask to repair the second defect on the mask.

17. A method of repairing an exposure, the method comprising:
- inspecting the mask to identify a defect on the mask;
- performing a cleaning process to the mask, the cleaning process including:
  - mixing sulfuric acid and hydrogen peroxide to form a sulfuric peroxide mixture having a first temperature; and
  - cooling the sulfuric peroxide mixture to form a non-thermal sulfuric peroxide mixture having a second temperature; and
- applying the non-thermal sulfuric peroxide mixture having the second temperature to the mask to repair the defect on the mask.

18. The method of claim 17, wherein the first temperature is at least 25° C. and the second temperature is less than 25° C.

19. The method of claim 17, wherein mixing sulfuric acid and hydrogen peroxide to form the sulfuric peroxide mixture having the first temperature includes mixing sulfuric acid and hydrogen peroxide with a sulfuric acid/hydrogen peroxide volume ratio ranging from 4:1 to 2:1.

20. The method of claim 17, further comprising:
- after applying the non-thermal sulfuric peroxide mixture having the second temperature to the mask to repair the defect on the mask, loading the mask into a lithography system; and
- performing a lithography exposing process on a wafer in the lithography system using the mask.

\* \* \* \* \*